United States Patent
Kwan et al.

(10) Patent No.: US 6,801,605 B1
(45) Date of Patent: Oct. 5, 2004

(54) TELEPHONE NETWORK SIGNAL CONVERSION SYSTEM

(75) Inventors: George Kwan, Sunnyvale, CA (US); Maria B. Hu, San Jose, CA (US); Burton B. Lo, San Francisco, CA (US); Anthony Pan, Fremont, CA (US)

(73) Assignee: 3Com Corporation, Santa Clara, CA (US)

( * ) Notice: Subject to any disclaimer, the term of this patent is extended or adjusted under 35 U.S.C. 154(b) by 566 days.

(21) Appl. No.: 09/660,825

(22) Filed: Sep. 13, 2000

(51) Int. Cl.⁷ .......................... H04M 11/00; H04M 9/00
(52) U.S. Cl. ............................ 379/93.15; 379/93.05; 379/93.06; 379/387.02; 379/392.01
(58) Field of Search ................................ 379/353, 350, 379/352, 93.08, 93.09, 93.15, 93.14, 386, 387.01, 387.02, 235, 236, 237, 281, 339, 345, 344, 392.01; 370/467, 493, 494, 495, 525, 526; 375/214, 216, 254; 455/22

(56) References Cited

U.S. PATENT DOCUMENTS

| | | | | |
|---|---|---|---|---|
| 4,053,926 A | * | 10/1977 | Lemoine et al. ............... | 358/8 |
| 5,216,696 A | * | 6/1993 | Poklemba .................... | 375/99 |
| 5,572,588 A | * | 11/1996 | Weng et al. ................. | 379/386 |
| 5,773,332 A | | 6/1998 | Glad ........................... | 439/344 |

OTHER PUBLICATIONS

Gihad Ghaibeh, ed. (1999), "Home Phoneline Networking Alliance: 1 M8 PHY Specification", version 1.03 (50 pages).
www.pc–card.com/about.htm web site printout (3 pages), Sep. 27, 2001.
www.pc–card.com/pccardstandard.htm web site printout (10 pages), Sep. 27, 2001.
www.pc–card.com/miniaturecard.htm web site printout (7 pages), Sep. 27, 2001.
www.compactflash.org/pr/980323.htm web site printout (2 pages), Sep. 27, 2001.

* cited by examiner

Primary Examiner—Rexford Barnie
(74) Attorney, Agent, or Firm—McDonnell Boehnen Hulbert & Berghoff

(57) ABSTRACT

An integrated circuit is provided to convert an analog telephone signal into a digital format. The integrated circuit includes an analog-digital converter coupled to an averager. Sampled analog values are averaged at intervals and compared to a threshold level to determine a digital value.

18 Claims, 4 Drawing Sheets

TELEPHONE NETWORK SIGNAL CONVERSION SYSTEM

BACKGROUND OF THE INVENTION

1. Field of the Invention

This invention relates to the field of converting home telephone signals. In particular, the invention relates to converting data contained in telephone signals from an analog format to a digital format.

2. Description of the Related Art

Home telephone systems are typically transmitted to buildings using an analog signal. Connecting computers using telephonic systems requires data transmissions on the telephone lines. The data transmissions are transmitted at bandwidths that are different than voice transmissions. The data transmissions are usually converted from an analog format to a digital format for use with a computing system using digital data.

FIG. 4 illustrates a conversion circuit 400 typically used to convert analog data in telephone lines into a digital signal for use with computing systems. The system includes an amplifier 410 that receives an analog input signal from the telephone line. The amplifier 410 reduces the detection of noise on the telephone line. The comparator 420 receives the signal and compares the signal to an analog threshold. The output from the comparator 420 is a signal having a digital format. The digital signal is signaled to feedback circuit 430. The feedback circuit 430 processes the signal to determine a digital threshold. A digital-analog converter 440 converts the digital threshold to an analog value. The analog value is used by comparator 420 to form the digital signal with the signal received from amplifier 410.

SUMMARY OF THE INVENTION

An integrated circuit is provided that samples analog telephone signals. A plurality of shifters store analog values sampled from the telephone signals at discrete time intervals over a duration. A plurality of shifters each carry an analog value for one of the sampled intervals during the duration. Each analog value is propagated through the shifters during the duration. An averager is coupled to the plurality of shifters to determine an average of the analog values carried by the shifters during each interval in the duration. A comparator is coupled to the averager

DETAILED DESCRIPTION

A. System Overview

Figure 4:
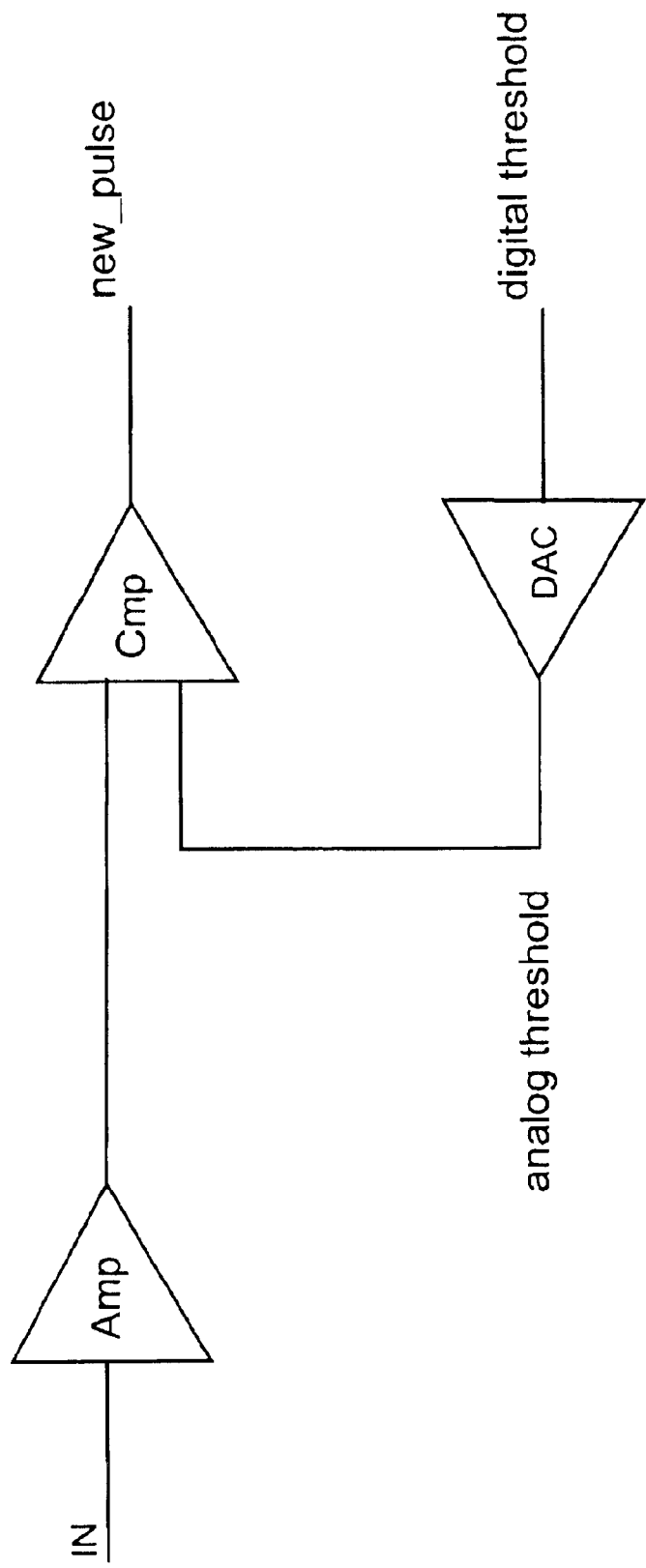
FIG. 4 is a circuit diagram for converting analog telephone signals to a digital format, under an embodiment of the invention.

Embodiments of the invention overcome several disadvantages of prior art systems, such as described with FIG. 4. Embodiments of the invention include an integrated component to convert the telephone signal into a digital format. The integrated component does not require external amplifiers or a comparator. Further, the integrated component implements an analog-digital converter to receive the analog telephone signal, so as to reduces the potential for analog noise to be carried through the conversion circuit as an error.

In contrast, previous systems use multiple non-integrated components, such as amplifier 410 and comparator 420. Further, the prior systems were prone to conversion error, caused by presence of analog noise passing through the many non-integrated components.

Embodiments of the invention may be used to establish network connectivity between multiple terminals using telephone lines. Examples of terminals for use with embodiments of the invention include personal computers, handheld devices including personal digital assistants, and network appliances.

B. Process for Converting Analog Telephone Signal

Figure 1:
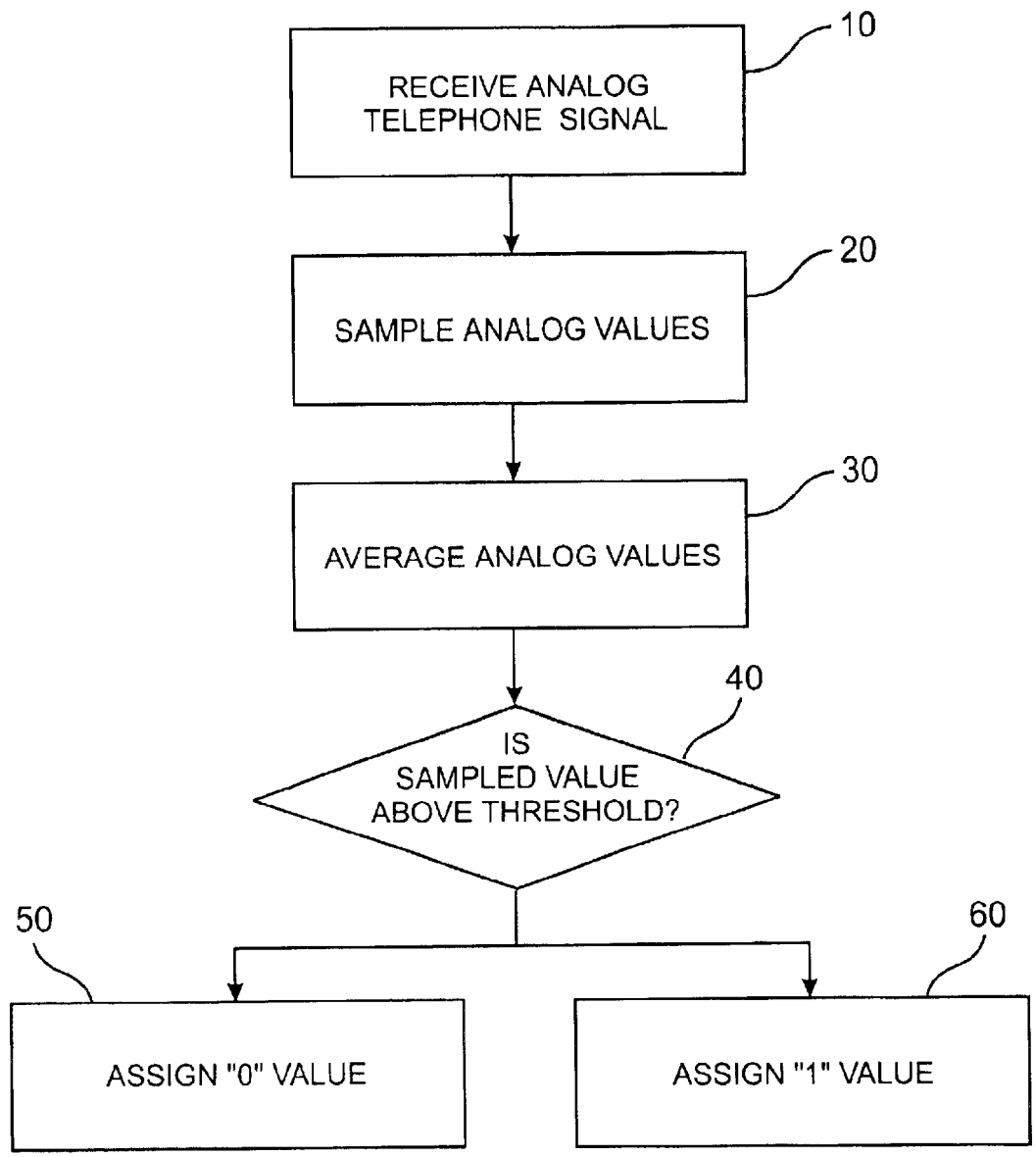
FIG. 1 is a flow process for converting an analog telephone signal to a digital format, under an embodiment of the invention.

FIG. 1 illustrates a process, used under an embodiment of the invention. Preferably, the process is reproduced on an integrated device. An example of an integrated device under an embodiment is shown with FIG. 2.

In step 10, an analog telephone signal is received by an integrated component. As mentioned, the integrated component may be a part of a computer device, including personal computers, peripheral devices, and network appliances.

In step 20, the analog signal is sampled for a plurality of analog values. The telephone signal may be sampled at discrete intervals.

In step 30, the analog values sampled over the duration of time are averaged. Preferably, the average is a moving average of the analog values sampled in step 20. The moving average may be determined by averaging sampled analog values of the analog telephone signals continuously over a duration or time period comprising many discrete sampling intervals. During the period in which the moving average is formulated, each new sampled analog value is substituted in to the average for the oldest sampled analog value in the period.

In step 40, the averaged values sampled from the analog signal are compared to a threshold value. The threshold value is determined to sufficiently distinguish data from noise on the analog signal. If the averaged values are determined to be less than the threshold values, then in step 50 the digital value corresponding to that sampled interval is given a "0" digital value. If the averaged values are determined to be greater than the threshold values, then in step 60, the digital value corresponding to that sampled interval is given a "1" digital value.

In other embodiments, a different measure of sampled analog values may be used to compare against a threshold value. For example, the analog values sampled from the telephone signal may be subject to a weighted average. The weighted average may be used in conjunction with the moving average of the sampled analog values.

C. Conversion Circuit for Integrated Device

An embodiment of the invention includes an integrated circuit. The integrated circuit may be used in conjunction with a personal computer system, or another computer system such as a network appliance. Logic functions may be performed on the circuit through software, hardware, firmware, or a combination thereof. An integrated circuit for use with an embodiment of the invention is described with FIG. 2.

Figure 2:
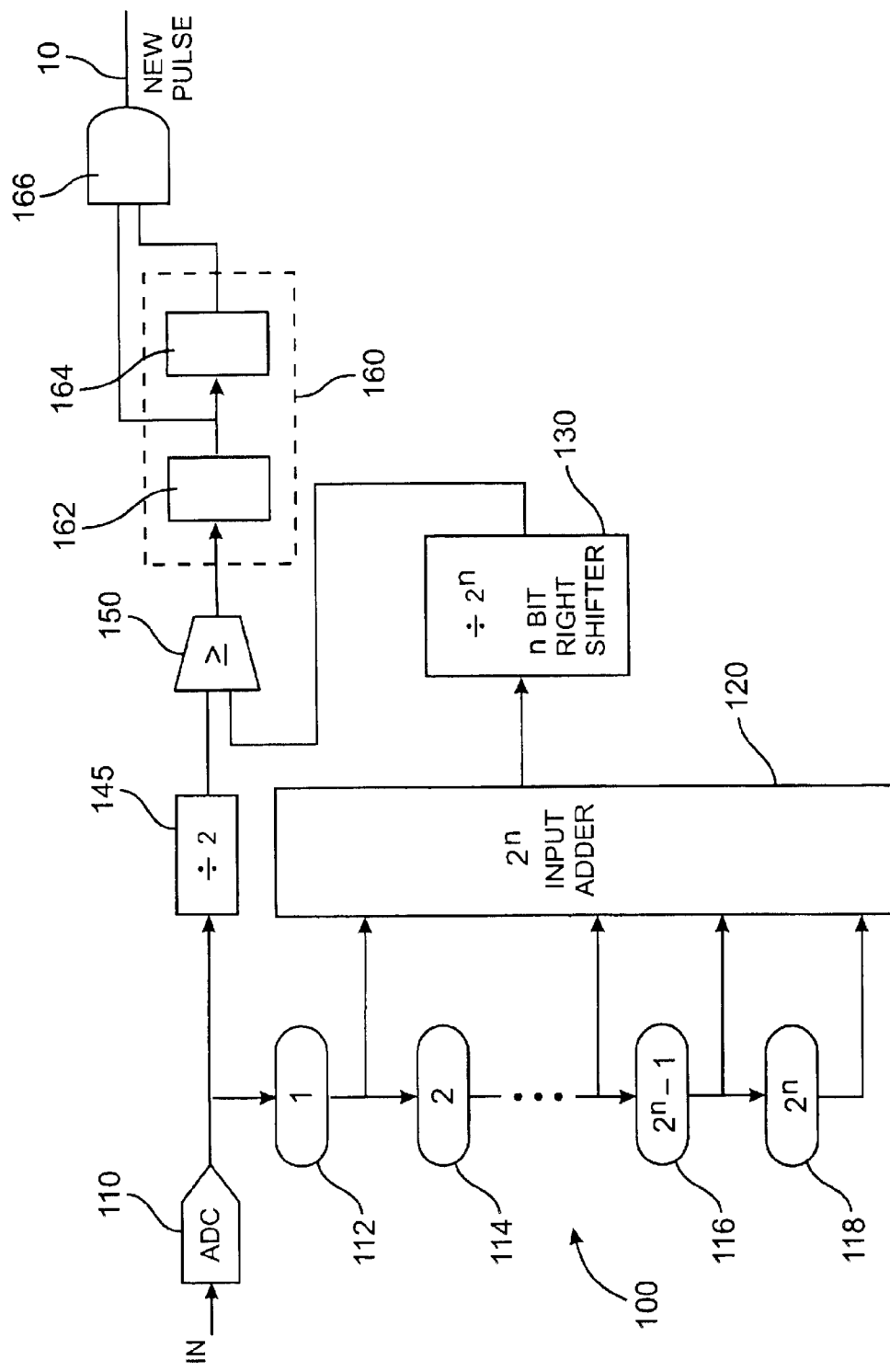
FIG. 2 is a circuit diagram, under an embodiment of the invention.

The circuit 100 shown in FIG. 2 includes an analog-digital converter (ADC) 110 that receives the telephone signal in the analog format. An output 102 of integrated circuit 100 carries information from the telephone signal in a digital format. The ADC 110 is coupled to a plurality of shifters 112–118. The shifters 112–118 are coupled to signal an adder 120. The adder 120 is coupled to signal a first divider 130. In this example, adder 120 is a $2^n$ adder, and divider 130 is a divide by $2^n$ operator.

A second divider 140 is coupled to receive a signal from ADC 110. The first divider 130 and second divider 140 each signal an input to a comparator 150. The comparator 150 is signaled to a deglitcher 160, including a first stage 162 and a second stage 164. The first and second stage 162, 164 are combined with an AND gate 166. The circuit 100 includes an output 102 that signals the telephone signal in the converted digital format.

A clock signal is used to define a period or sample rate for ADC 110. During each period, ADC 110 samples the analog input and outputs a digital signal representing the analog value inputted to ADC 110. The analog value is signaled to first shifter 112. The analog input signal is sampled by ADC 110 in a subsequent interval or period, triggered by the clock signal. The analog value of the signal in the subsequent interval is signaled to first shifter 112. In the same clock signal, the value stored in first shifter 112 is shifted to second shifter 114. In the example shown, the telephone signal to ADC 110 is signaled during a third interval. This value is signaled to first shifter 112. During the same clock signal, the value stored in second shifter 114 is shifted to third shifter 116. Likewise, previous analog value stored in first shifter 112 is shifted to second shifter 114. The fourth clock interval causes another shifting, with the fourth shifter 118 carrying the analog interval of the first interval, third shifter 116 carrying the analog value of the second interval, second shifter 114 carrying the analog value of the third interval, and first shifter 112 carrying the analog value of the first interval.

The shifting process may be repeated for n shifters. The analog value carried by the last of n shifters is shifted our of the circuit altogether with the next clock signal. The number of shifters n depends on the accuracy desired for converting the analog telephone signal to the digital format.

The adder 120 sums the values carried by each shifter 112–118 with each clock signal. The first divider 130 combines with adder 120 to average the analog values carried by all the shifters 112–118 during each clock signal. The output of first divider 130 is signaled to comparator 150. The comparator 150 serves to identify a new data pulse on the analog input.

As will be described, the input from first divider 130 serves as a threshold voltage value for comparator 150. The comparator 150 uses the output of first divider 130 to compare against a scaled input of the telephone signal. The scaled input is provided by second divider 140. In this way, the threshold level used by the comparator fluctuates based on past analog values of the telephone signal.

In an embodiment, comparator 150 performs a greater-than comparison for a result of second divider 140 and an input analog value of the telephone signal. Preferably, the function performed by comparator 150 is:

$$analog\_input\_value >= 2*average\_value \quad (1)$$

The analog_input_value corresponds to the value measured by ADC 110 during a sample period. The average_value represents the output from the first divider 130, representing the average of the analog values carried by the different registers 112–118.

If the left-hand side (LHS) of equation (1) is greater than the right-hand side (RHS), then an analog pulse detected by ADC 110 is assumed to be an asserted logic value (i.e. "1"). If the LHS of equation (1) is less than the RHS, then the pulse is assumed to either not carry information (noise), or be an unasserted digital value (i.e. "0").

If the LHS>RHS, an asserted logic signal is received by first stage 162 of the deglitcher 160. Else, an unasserted logic signal is received. The first stage 162 passes the digital signal through. The output of the first stage is also signaled to second stage 164. Since the second stage 164 is an extra component, there is a time-lag between the output of the first and second stage 162, 164. The time-lag may, for example, correspond to one clock cycle. The output of the first and second stages 162, 164 are combined using an AND gate 166.

The deglitcher 160 thus identifies spikes in the input signal that carry high analog values. The spikes, by nature, are identified as being too narrow for data transmission. The narrow characteristic of such glitches are identified by the clock differential between the first and second stages 162, 164. For asserted logic signals received by first and second stages 162, 164, AND gate 166 outputs as asserted value only if the duration of the asserted signal output by comparator 150 is longer than the time gap between first and second stage 162, 164.

In this way, if the duration of the analog signal to ADC 110 exceeds the time differential between first and second stage 162, 164, then the analog values identified by ADC 110 as being asserted logic values are presumably data. If the duration of the signal to ADC 110 is less than the time differential between first and second stage 162, 164, then the analog values identified by ADC 110 are assumed to be a glitch spike. Such glitches or spikes may be the result of, for example, electrical surges.

Thus, circuit 100 uses b-it averaging to identify when an analog signal transfers between noise and data. The glitch detector detects when the analog signal is spiked.

While an embodiment of the invention includes second divider 140 and comparator 150 which combine to perform equation (1), other embodiments may include other components to modify the equation. For example, a scaling factor of analog_input_value is assumed to be 2 when compared to average_value. Other embodiments may use a smaller number, such as a fraction, or a greater number. The scaling factor used determines on the performance of ADC 110, as well as the sensitivity of the circuit to glitches and noise.

Figure 3:
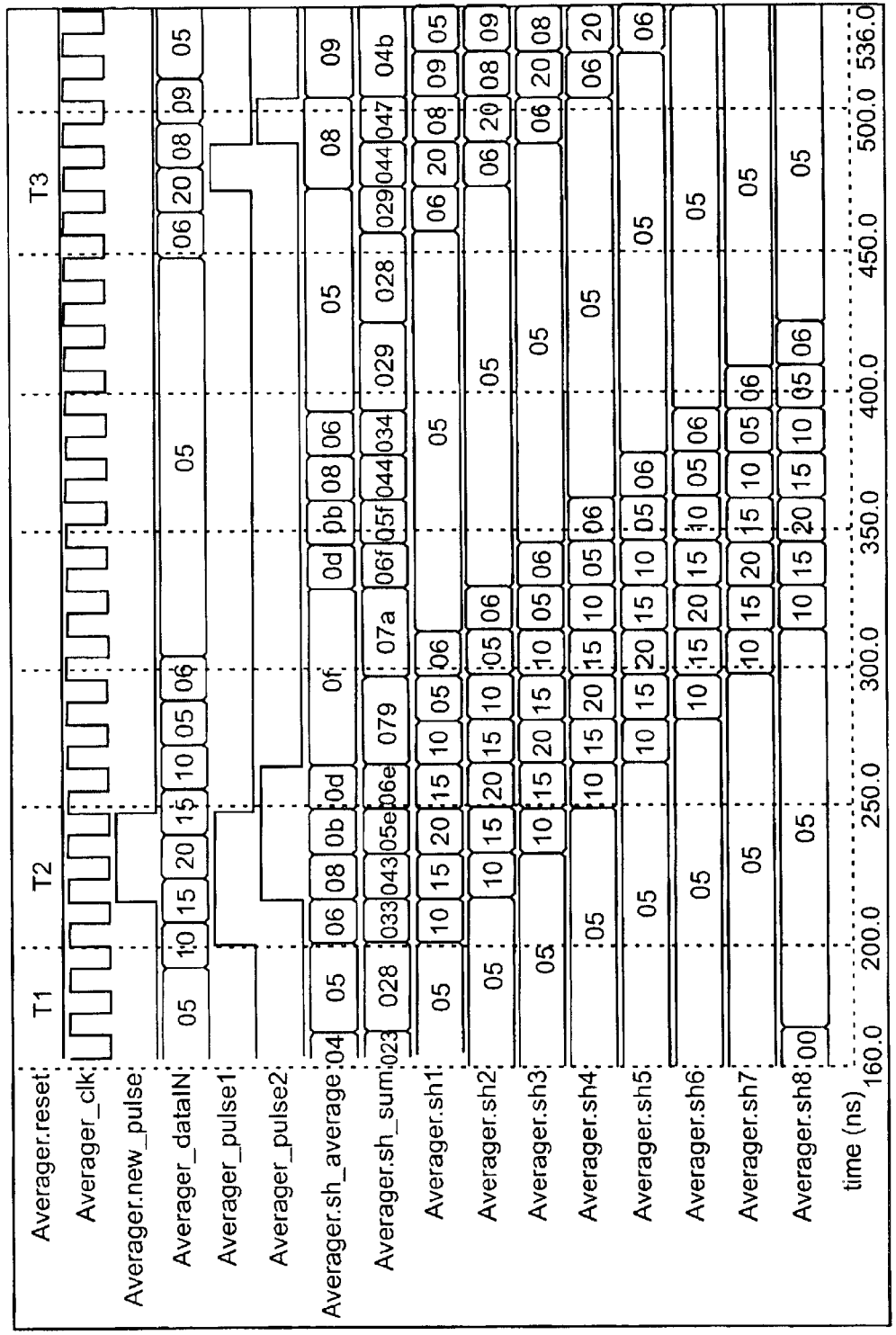
FIG. 3 is a timing diagram, representing data values processed under an embodiment of the invention.

FIG. 3 is an illustrative example of how analog signals are carried through and converted into digital signals by the integrated circuit shown by FIG. 1. The clock signal is show by Averager_clk.

The value of the analog signal sampled from the input to the integrated circuit is shown by Averager_dataIN. The Averager_dataIN shows that every uptick of Averager_clk causes a new analog value to be read from the input signal. The signal carried by each right shifter 112–118 is shown by the signals Averager.sh1, Averager.sh2 . . . Averager.sh8. Each sampled analog value is propagated with the uptick of the clock signal through the right shifters of the integrated circuit. The value from adder 120 is shown by Averager.sh_sum. The value from divider 130, corresponding to an output of the averager circuit formed by the combination of adder 120 and divider 130, is shown by Averager.sh_average.

In the example shown, the sampled analog value for a first duration T1 is 5, and corresponds to noise, with no data. The example assumes the sampled value of the analog signal before T1 was continuously at 5 (noise). During T1, each shifters 112–118 carry the value 5. The duration T1 and T2 includes 3 uptick signals of Averager_clk. Beginning at the end of T1 and continuing through a second duration T2, the value of the analog signal sequentially changes from noise level to 10, 15, 20, and 15, with each uptick of Averager_clk. With the first uptick, the analog value of 10 is carried by right shifter 10, and the other shifters carry analog values corresponding to the previous signal (noise). After the second uptick, the first shifter 112 carries 15 and the second shifter 114 carries 10. With the third uptick, the analog value of 10 is propagated to the third shifter 116, the second shifter 114 includes 15, and the first shifter has 20. The last shifter still carries the noise level. With the last uptick, the last shifter 118 carries the 10, the third shifter 116 has the 15, the second shifter 114 includes the 20, and the first shifter 112 has the new sampled analog value of 15.

FIG. 3 illustrates use eight of right shifters with the integrated circuit shown by FIG. 2. With eight right shifters, after T2 right shifters 112–118 carry analog values other than noise, and the remaining shifters carry values corresponding to analog noise. The signal Averager.sh_sum corresponds to the sum of the analog values carried by all eight shifters. A hexadecimal representation of the summed value is shown in FIG. 3. The values shown by Averager.sh_average represent the average, as determined by the divider 130 dividing the sum from adder 120 by the number of shifters.

The representation Averager_pulse1 represents the output from comparator 150. In an embodiment, comparator 150 asserts a value when equation (1) is true. Else, the comparator 150 signal does not assert a value. With reference to FIG. 3, equation (1) is determined using the values for Averager.sh_average (i.e. analog_input_value) and Averager.new_pulse (i.e. average_value). With each uptick of Averager_clk, equation (1) is processed to determine whether Averager_pulse1 is asserted or not.

The representation by Averager_pulse2 is equivalent to Averager_pulse1, delayed by a duration designated to identify glitches from data transmissions. The assumption is that glitches are short in duration, but may spike sufficiently in amplitude to cause equation (1) to be true. As a result, glitches may cause Averager_pulse1 to be asserted. The Averager_pulse2 in effect causes the duration of the signal to be measured. As shown by FIG. 2, deglitcher 160 uses AND gate 166 to combine the outputs from first stage 162 and second stage 164. The output from first stage 162 is equivalent to Averager_pulse1, and the output from second stage 163 is equivalent to Averager_pulse2.

When an AND function is performed, the result is represented in FIG. 3 with Averager.new_pulse. During interval T2, the combination Averager_pulse1 of Averager_pulse2 is an asserted logic value. The asserted logic value is output 102 of integrated circuit 100. As an example, another duration T3 shows that telephone signal is shown to carry a glitch, resulting in brief asserted values for Averager_pulse1 and Averager_pulse2. When combined by AND gate 166, the output 102 of integrated circuit 100 is an unasserted logic value.

In the example provided by FIG. 3, the second duration T2 includes analog data transmission sufficient in duration to be interpreted as data. In time duration T3, the analog data duration is short, so that when Averager_pulse1 and Averager_pulse2 are combined, the result is 0 (no assertion).

Over a continuous period of time, the conversion process shown by FIG. 3 is repeated to produce digital signals from the analog telephone signal. Noise and glitches are identified in the process from analog values representing data.

D. Conclusion

The foregoing description of various embodiments of the invention has been presented for purposes of illustration and description. It is not intended to limit the invention to the precise forms disclosed. Many modifications and equivalent arrangements will be apparent.

What is claimed is:

1. An integrated circuit comprising:
an analog-digital converter to sample a plurality of analog values from a telephone signal, the plurality of analog values being sampled over a duration comprising a plurality of discrete time intervals;
a plurality of shifters aligned so that each shifter carries one of the plurality of analog values sampled at one of the plurality of discrete intervals in the duration, each of the plurality of analog values being sequentially shifted through the plurality of shifters with each interval in the duration;
an averager coupled to the plurality of shifters to determiner an average of the analog values carried by the plurality of shifters during each interval in the duration; and
a comparator coupled to the averager to compare the average of the analog values with a threshold level to determine a logic value of the telephone signal at one or more intervals in the duration.

2. The integrated circuit of claim 1, wherein the averager includes an adder, the adder being coupled to the plurality of shifters to add the sampled analog values carried by the plurality of shifters during each interval in the duration.

3. The integrated circuit of claim 1, further comprising a deglicher to identify whether one or more of the sampled analog values in the duration is a glitch.

4. The integrated circuit of claim 3, wherein the deglitcher detects a duration of an asserted logic value determined by the comparator to identify the glitch.

5. The integrated circuit of claim 4, wherein the deglitcher comprises a first stage and a second stage, the first stage and the second stage each receiving a same output of the comparator, the first stage and the second stage being time-shifted to receive the same value one interval apart.

6. The integrated circuit of claim 5, further comprising an AND gate to combine an output of the first stage and an output of the second stage.

7. The integrated circuit of claim 2, wherein the adder is a $2^n$ input adder, with n equaling the number of shifters.

8. The integrated circuit of claim 7, wherein the averager includes a divider that divides a sum determined by the adder corresponding to the values carries by the plurality of shifters at each interval.

9. The integrated circuit of claim 8, wherein the divider is a divide-by-$2^n$ operator.

10. The integrated circuit of claim 1, wherein the comparator determines whether an analog input value most recently sampled on the telephone signal is greater than or equal to a factor comprising the average of the analog values.

11. A method for converting an analog telephone signal into a digital format, the method comprising:

sampling the analog telephone signal over a duration comprising a plurality of discrete time intervals to produce a plurality of analog values;

averaging the sampled analog values carried by a plurality of shifters during each interval in the duration; and comparing at one or more intervals in the duration the averaged sampled analog values with a scaled analog value of the telephone signal to determine a logic value for the sampled analog telephone signal.

12. The method of claim 11, wherein averaging the sampled analog values includes sequentially shifting each of the plurality of analog values through a plurality of shifters using a clock signal.

13. The method of claim 12, wherein periodically averaging the sampled analog values includes summing the analog values carried by each shifter upon an interval identified by the clock signal.

14. The method of claim 13, wherein averaging the sampled analog values includes dividing a sum of the analog values carried by each of the shifters upon an interval identified by the clock signal.

15. The method of claim 11, further comprising deglitching the determined logic value using a measure of duration for an asserted logic value.

16. A system for converting an analog telephone signal into a digital format, the system comprising:

a sampling means for sampling analog values of a telephone signal over a duration comprising a plurality of discrete time intervals to produce sampled analog values;

an averaging means to average the sampled analog values during each interval in the duration; and a comparator coupled to the averaging means to compare at one or more intervals in the duration an average value determined by the averaging means with a scaled input from the telephone signal to determine whether a logic value is to be asserted.

17. The system of claim 16, further comprising a deglitching means for identifying asserted logic values determined by the comparator from glitches on the telephone signal.

18. The system of claim 16, wherein the averaging means averages the sampled analog values over the duration repeatedly at each time interval in the duration.

* * * * *